(12) United States Patent
Datskos et al.

(10) Patent No.: US 8,988,061 B2
(45) Date of Patent: Mar. 24, 2015

(54) NANOMECHANICAL ELECTRIC AND ELECTROMAGNETIC FIELD SENSOR

(75) Inventors: Panagiotis George Datskos, Knoxville, TN (US); Nickolay Lavrik, Knoxville, TN (US)

(73) Assignees: U.S. Department of Energy, Washington, DC (US); UT-Battelle, LLC, Oak Ridge, TN (US)

( * ) Notice: Subject to any disclaimer, the term of this patent is extended or adjusted under 35 U.S.C. 154(b) by 926 days.

(21) Appl. No.: 13/024,833

(22) Filed: Feb. 10, 2011

(65) Prior Publication Data

US 2012/0206609 A1    Aug. 16, 2012

(51) Int. Cl.
*G01R 31/00* (2006.01)
*G01R 29/08* (2006.01)
*G01R 1/067* (2006.01)

(52) U.S. Cl.
CPC ........ *G01R 29/0878* (2013.01); *G01R 1/06738* (2013.01); *G01R 1/06744* (2013.01)
USPC .......................................................... 324/96

(58) Field of Classification Search
None
See application file for complete search history.

(56) References Cited

U.S. PATENT DOCUMENTS

| | | | | |
|---|---|---|---|---|
| 3,413,573 | A * | 11/1968 | Nathanson et al. | ............ 332/178 |
| 4,721,925 | A | 1/1988 | Farace et al. | |
| 5,696,491 | A * | 12/1997 | White et al. | ................. 340/657 |
| 5,783,973 | A | 7/1998 | Weinberg et al. | |
| 5,976,390 | A * | 11/1999 | Muramatsu | ........................ 216/2 |
| 6,835,926 | B2 | 12/2004 | Weitekamp et al. | |
| 6,984,994 | B2 | 1/2006 | Gregg | |
| 7,152,804 | B1 * | 12/2006 | MacKenzie et al. | .......... 235/492 |
| 7,315,173 | B2 * | 1/2008 | Funato et al. | ................. 324/632 |
| 7,336,062 | B2 * | 2/2008 | Mitrofanov | ...................... 324/96 |
| 7,408,147 | B2 | 8/2008 | Blick et al. | |
| 7,491,934 | B2 * | 2/2009 | Jesse et al. | .................... 250/310 |
| 7,511,870 | B2 | 3/2009 | Ho et al. | |
| 2009/0238236 | A1 | 9/2009 | Fleury-Frenette et al. | |

FOREIGN PATENT DOCUMENTS

| | | |
|---|---|---|
| CN | 1516909 A | 7/2004 |
| CN | 101303365 A | 11/2008 |
| CN | 201352121 Y | 11/2009 |
| GB | 2 318 231 A | 4/1998 |
| RU | 2 170 439 C1 | 7/2001 |
| WO | WO 2010/000689 A1 | 1/2010 |

OTHER PUBLICATIONS

Czaplewski, D.A. et al., "Nanomechanical oscillators fabricated using polymeric nanofiber templates," Sch. Appl. Phys., Nano Letters, Mar. 2004, vol. 4, Issue 3, pp. 437-439, (Abstract).

* cited by examiner

*Primary Examiner* — Paresh Patel
(74) *Attorney, Agent, or Firm* — Pauley Petersen & Erickson

(57) ABSTRACT

The present invention provides a system for detecting and analyzing at least one of an electric field and an electromagnetic field. The system includes a micro/nanomechanical oscillator which oscillates in the presence of at least one of the electric field and the electromagnetic field. The micro/nanomechanical oscillator includes a dense array of cantilevers mounted to a substrate. A charge localized on a tip of each cantilever interacts with and oscillates in the presence of the electric and/or electromagnetic field. The system further includes a subsystem for recording the movement of the cantilever to extract information from the electric and/or electromagnetic field. The system further includes a means of adjusting a stiffness of the cantilever to heterodyne tune an operating frequency of the system over a frequency range.

20 Claims, 6 Drawing Sheets

NANOMECHANICAL ELECTRIC AND ELECTROMAGNETIC FIELD SENSOR

GOVERNMENT RIGHTS

This invention was made with government support under Contract No. DE-AC05-00OR22725 awarded by the U.S. Department of Energy. The government has certain rights in the invention.

FIELD OF THE INVENTION

The present invention relates to a system for sensing an electric field and/or an electromagnetic field. More particularly, the invention relates to a nanomechanical oscillator for sensing an electric field and/or an electromagnetic field, which is tunable over a frequency range.

BACKGROUND OF THE INVENTION

Known systems for sensing static electric fields and/or time-varying electric fields (electromagnetic fields) utilize an antenna and a receiver. In these known systems, the sensitivity of the system is dependent on the design of the antenna and the receiver electronics. However, these antenna-based systems do not exhibit high sensitivity over a broad frequency or wavelength range.

Another drawback of these known systems is their size. The size of the antenna is related to a wavelength of the electric field. As a result, the dimensions of these known systems are relatively large, especially at lower frequencies, thereby preventing the design and creation of a compact electric field sensor.

As such, there exists a need for a sensor for detecting electric and/or electromagnetic fields, which is sensitive over a broad frequency range and has dimensions suitable for a compact design.

SUMMARY OF THE INVENTION

The present invention includes a system for sensing an electric field and/or an electromagnetic field that is capable of high sensitivity over a broad frequency range. The present invention utilizes a micro/nanomechanical system (MNS) to detect very small electric fields (μV/m) over a large frequency range while maintaining substantial power efficiency. As used herein, references to the MNS and the nanomechanical system are to be understood to refer to at least one of the micromechanical system and the nanomechanical system.

The present invention is based on the interaction of an electric charge q with at least one of the electric field and the electromagnetic field. The electric charge is preferably localized on a cantilever and the cantilever is mounted generally perpendicular to a substrate. The substrate is preferably manufactured from a semiconductor material, for example silicon. In a preferred embodiment, the cantilever includes a stem and a tip which is positioned on the stem at a position opposite of the substrate. The tip is preferably manufactured from a material capable of maintaining the electric charge q and in a shape that allows for uniform distribution of the charge. In one embodiment, the tip is a glass microsphere. To localize the electric charge and to prevent the loss of charge, the stem is preferably made of an electrically nonconductive material.

In operation, as a target electric field passes through the MNS, a positive charge of the tip interacts with the target electric field oscillating from side to side tracing a wave of the target electric field. After the target electric field passes the cantilever returns to the generally perpendicular initial position.

The system of this invention may also include a subsystem for measuring and recording the movement of the cantilever in response to the target electric field. The subsystem is also preferably capable of extracting information of the target electric field from the movement of the cantilever. According to a preferred embodiment, the subsystem for measuring and recording the movement of the cantilever is an optical readout system. The optical readout system includes a driver and a light source positioned over and at an angle to the substrate. Light from the light source passes through a projecting optics and onto the substrate, the light reflects off the cantilever and the substrate and into a digital camera. In a preferred embodiment, the reflected light passes through imaging optics and/or spatial filtering before being recorded by the digital camera. The recorded motion of the cantilever is received and processed by a digital signal processor to extract information about the target electric field and/or electromagnetic field including, for example, a frequency of the target electric field. An embodiment of the subsystem for measuring and recording the movement of the cantilever can further include high magnification (diffraction limited) optics, a MHz range voltage source and a stroboscopic video analyzer.

In order to achieve both high dynamic range and wide spectral response, the system of this invention should be capable of tuning a cantilever operating frequency. In one embodiment, the cantilever operating frequency is tunable by including a piezoelectric element to a base of the cantilever, which can serve to modify a stiffness of the cantilever. Another embodiment involves the modulation of an applied voltage, $V(t)=V_0 \cos(\omega_r t+\phi)$, of the cantilever.

BRIEF DESCRIPTION OF THE DRAWINGS

The above-mentioned and other features and objects of this invention will be better understood from the following detailed description taken in conjunction with the drawings wherein.

DETAILED DESCRIPTION OF THE INVENTION

The present invention utilizes micro/nanomechanical structures (MNS) to detect an electric field and/or an electromagnetic field (a time varying electric field). The invention is based on the interaction of an electric charge, localized on a cantilever, with the electric field and/or the electromagnetic field. As used herein, to ease the description, references to the electric field are to be understood to refer to at least one of the electric field and the electromagnetic field.

Figure 1:
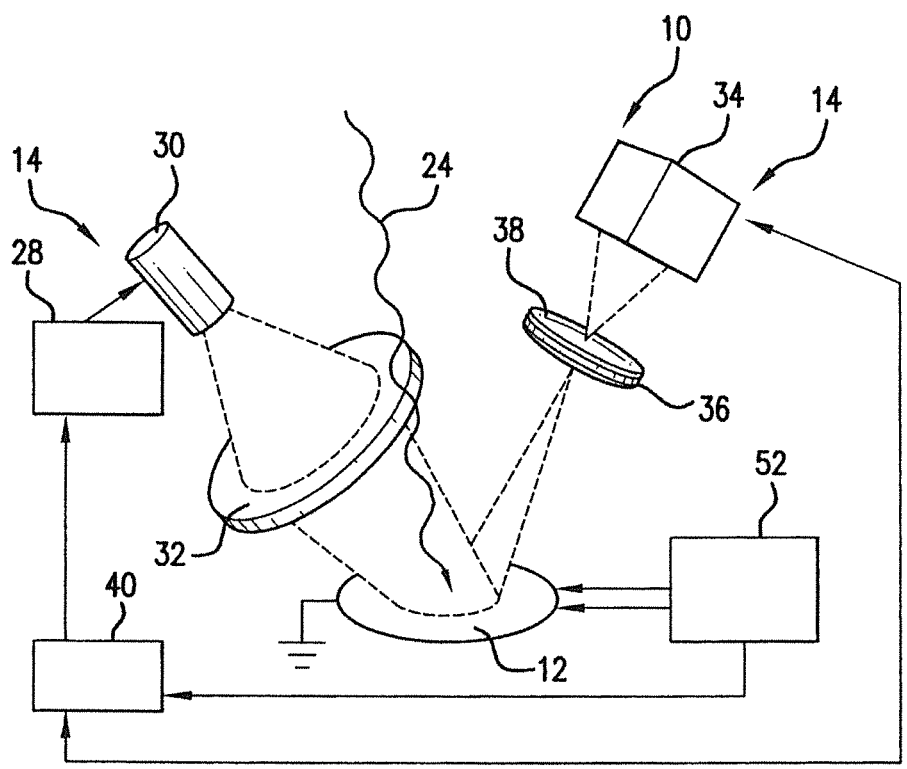
FIG. 1 is a perspective view of a system for detecting at least one of an electric field and an electromagnetic field according to one embodiment of this invention.

FIG. 1 shows a preferred embodiment of a system 10 of this invention. In this embodiment, the system 10 includes a MNS 12 and a subsystem 14 for measuring and recording the movement of the MNS 12 in response to a target electric field. The system 10 is capable of detecting electric fields having a frequency from 10 (0.1) to $10^6$ ($10^9$) Hz. In a preferred embodiment, the MNS 12 of this invention is disposed in an inert gas atmosphere.

Figure 2:
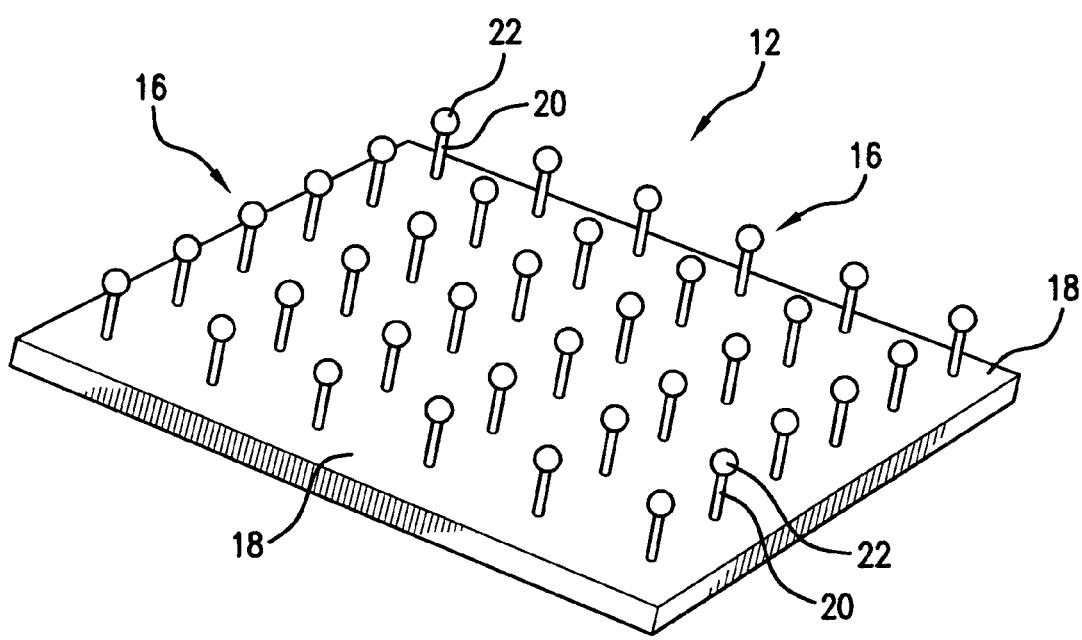
FIG. 2 is a perspective view of a micro/nanomechanical structure according to the embodiment of FIG. 1.
Figure 3:
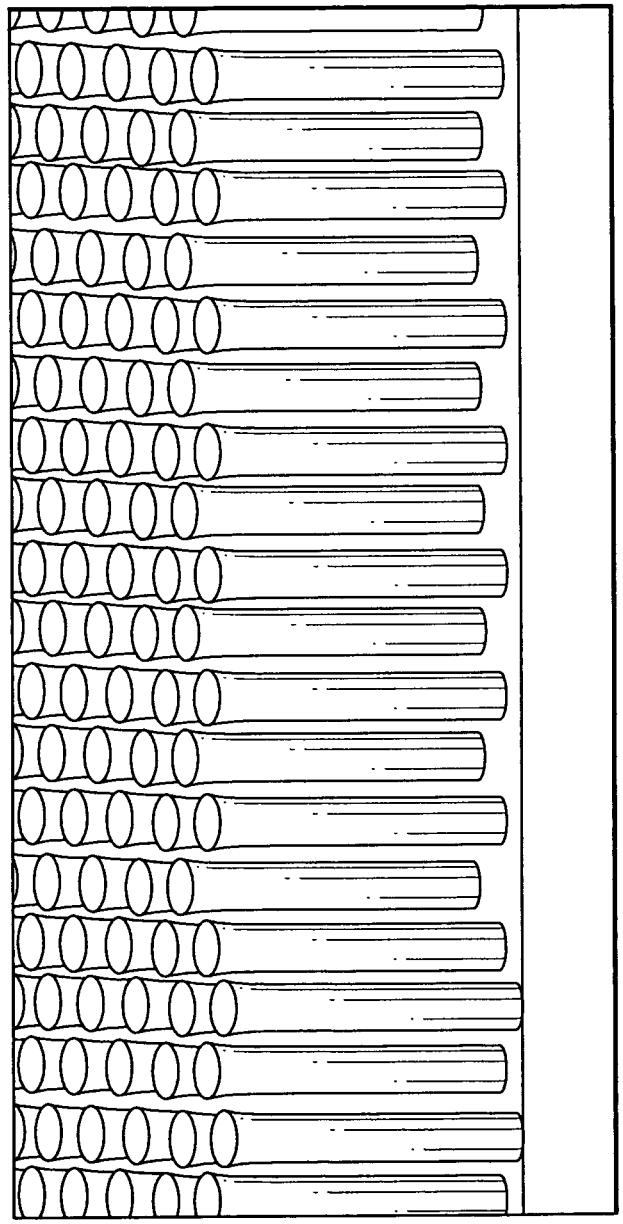
FIG. 3 is a magnified photograph of an embodiment of the micro/nanomechanical structure of this invention.

FIG. 2 shows the MNS 12, not necessarily shown to scale, according to one embodiment of this invention. In this embodiment, a 6×6 array of cantilevers 16 are mounted generally perpendicular to a substrate 18. However, it should be understood that the array of cantilevers 16 can include any number cantilevers 16 and is desirably a dense array that is capable of achieving high spatial resolution as well as high sensitivity. In order to achieve high spatial resolution and high sensitivity, the array of cantilevers 16 preferably comprises a dense array having from 100 to $10^5$ cantilevers per millimeter$^2$. For example, the array in the photograph of FIG. 3 has $10^5$ cantilevers per millimeter$^2$.

Figure 4:
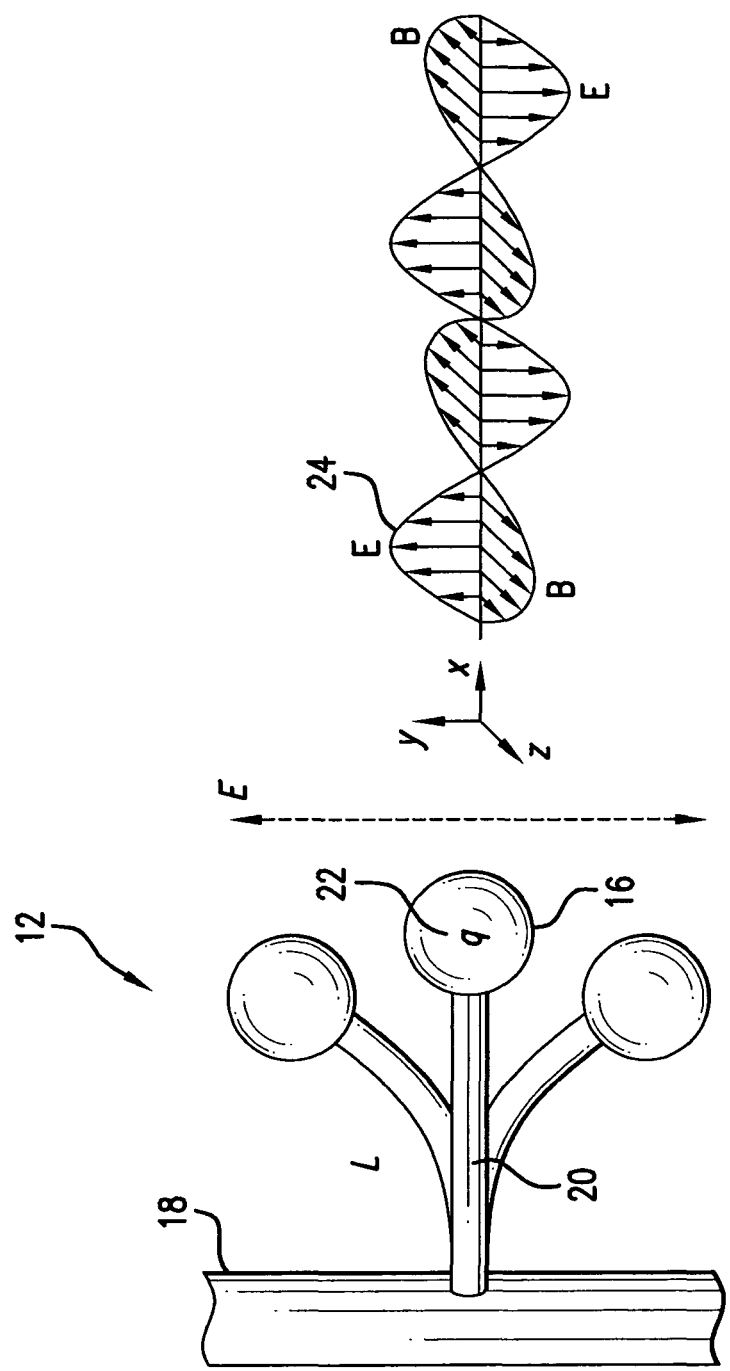
FIG. 4 is a side view of the micro/nanomechanical structure and an electric field according to one embodiment of this invention.
Figure 5:
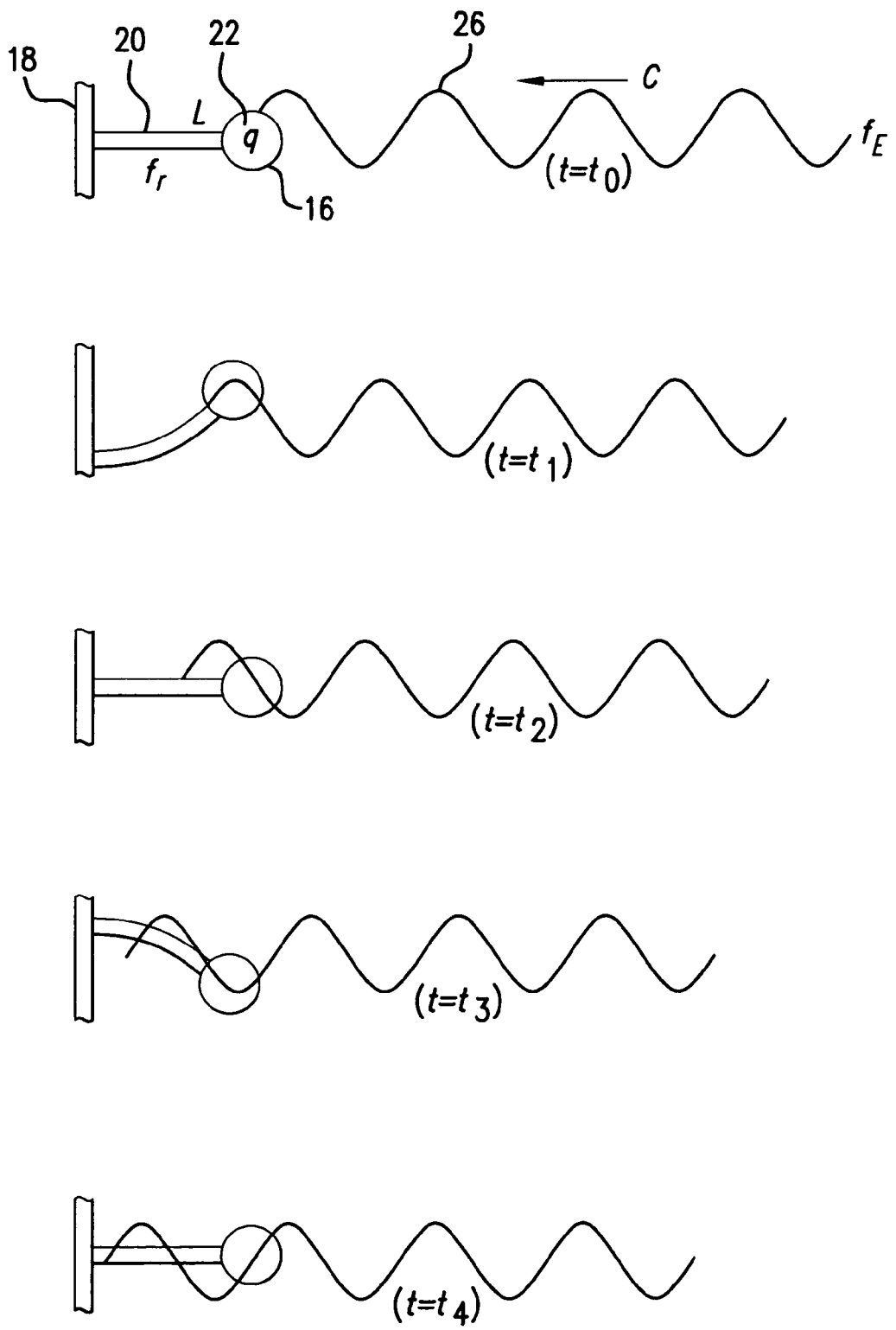
FIG. 5 is the side view of the micro/nanomechanical structure of FIG. 4 with an electric field at five discrete periods of time.

FIGS. 4 and 5 show an embodiment of this invention with a single cantilever 16 mounted generally perpendicular to the substrate 18 and an external electric field 24. The substrate 18 is preferably manufactured from a semiconductor material such as, but not limited to, silicon. In an alternative embodiment, the substrate can be manufactured from a variety of materials including, but not limited to, silicon nitride, silicon oxide, aluminum oxide and aluminum nitride.

The cantilever 16 includes a stem 20 and a tip 22. The stem 20 is mounted generally perpendicular to the substrate 18 and the tip 22 is positioned on the stem 20 at a position opposite from the substrate 18. The stem 20 can be manufactured from any suitable material including, but not limited to, silicon. In a preferred embodiment, the stem 20 is made of an electrically nonconductive material.

The tip 22 is made of a conductive or nonconductive material capable of maintaining an electric charge q. In an alternative embodiment, the tip 22 is made of an electret material which is capable of holding an electric charge for long time periods including many years. In a preferred embodiment, the tip 22 comprises glass however, the tip material can be any suitable material including, but not limited to, silicon. The electric charge q can be either a positive charge or a negative charge. In a preferred embodiment, the electric charge q is a positive charge which can be better maintained on the tip 22. Methods of depositing the charge q on the tip 22 include, but are not limited to, using an electron beam (negative charge), using an ion beam (positive charge), by applying a negative charge and by applying a positive charge. In a preferred embodiment, the tip 22 comprises a spherical shape that allows for a generally uniform distribution of charge, however, the tip 22 may be designed as any other shape. In one embodiment, the tip 22 is a glass microsphere with a positive charge q.

In a preferred embodiment, the cantilever 16 has a length ranging from 1 to $10^3$ micrometers and a width to length ratio ranging from 0.01 to 0.3. In a preferred embodiment, the cantilever 16 is capable of oscillating with an amplitude greater than 5% of a length of the stem 20.

Figure 6:
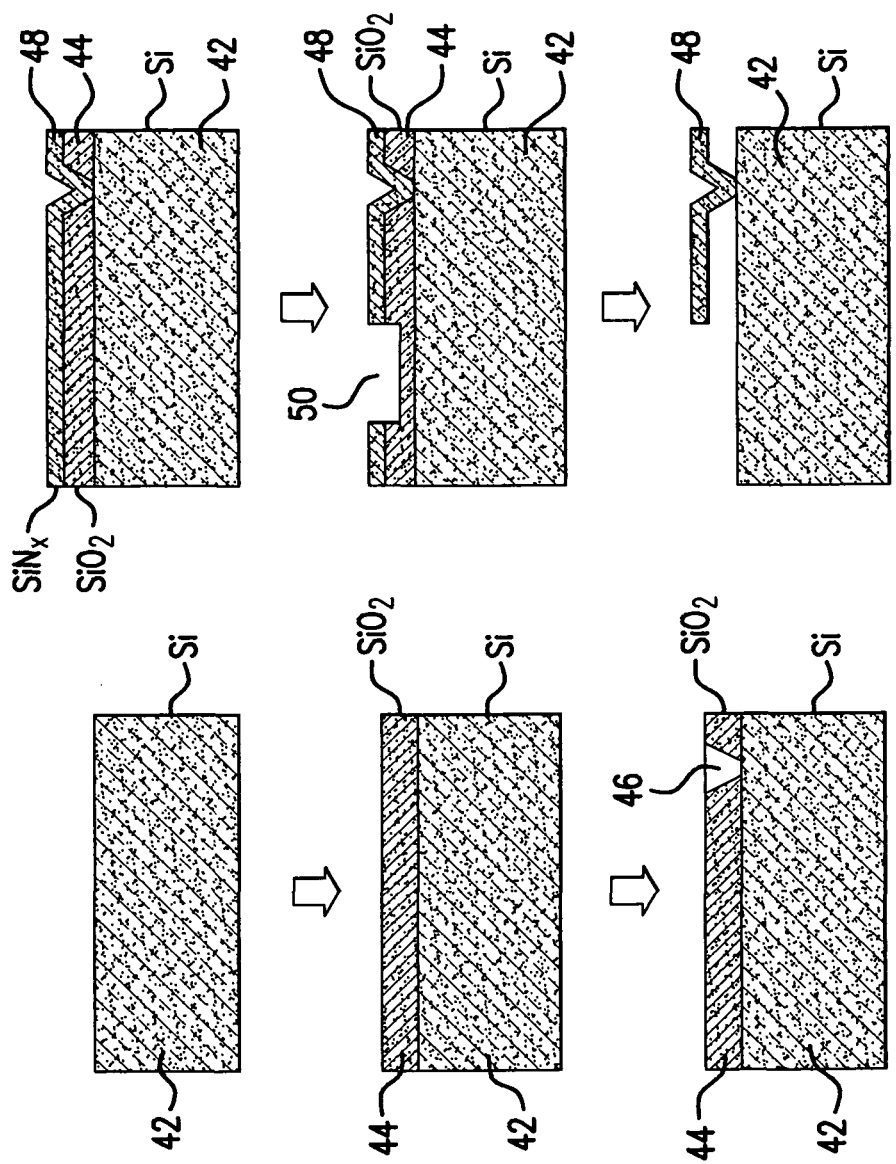
FIG. 6 is a representation of a photolithography fabrication steps involved in producing an embodiment of the micro/nanomechanical structure of this invention.

FIG. 6 shows an embodiment of a method for manufacturing the substrate 18 and the stem 20. This method uses photolithography fabrication steps to construct the substrate 18 and the stem 20. The process begins with a silicon (Si) wafer 42. A sacrificial layer of silicon dioxide 44 ($SiO_2$) is then applied to the Si wafer 42 using plasma-enhanced chemical vapor deposition (PECVD). Next an anchoring point 46 is etched into the sacrificial layer 44 of $SiO_2$ using reactive ion etching (RIE). A layer of low stress silicon nitride 48 ($SiN_x$) is then applied to the sacrificial layer 44 of $SiO_2$ and the anchoring point 46 using PECVD as a structural layer. Next, resonators 50 are patterned using RIE etching. In the next step the sacrificial layer 44 of $SiO_2$ is removed with a wet etch. The array of vertical cantilevers shown in FIG. 3 was manufactured using this process. In a preferred embodiment, the tip can be applied to the stem with a deposition technique, for example PECVD, that creates a nonconformal coating. In an alternative embodiment, the above process can be adapted to use single crystal Si, amorphous Si or low stress silicon nitride ($SiN_x$) as a structural layer. These materials are known for their excellent chemical stability, mechanical properties and compatibility with a variety of patterning/etching techniques.

Using the method described above, the cantilever 16 is capable of oscillating with large amplitudes and with a resonance frequency in the MHz. In a preferred embodiment, the cantilever 16 is capable of oscillating with an amplitude greater than 5% of a length of the stem 20.

FIG. 5 shows an interaction of the cantilever 16 with an incoming sinusoidal electric field 26 at five discrete moments for one period, time $t=t_0$ to $t=t_4$. At time $t=t_0$, the sinusoidal electric field 26 approaches the cantilever 16 while the cantilever is centered and/or at rest in a generally perpendicular state. As the sinusoidal electric field 26 propagates, the cantilever 16 traces the sinusoidal electric field 26 to an apex, at $t=t_1$, back to the initial state, at $t=t_2$, down to a trough, at $t=t_3$, and back to the initial state, at $t=t_4$. After the sinusoidal electric field 26 passes the MNS 12, the cantilever 16 stops responding.

FIG. 1 shows an embodiment of a subsystem 14 for measuring and recording the movement of the cantilever 16 in response to the sinusoidal electric field 26. This subsystem 14 is an optical readout system. The optical readout system includes a driver 28 and a light source 30 positioned over and at an angle to the MNS 12. In a preferred embodiment, the light source 30 is a light emitting diode (LED). Light from the light source 30 passes through projecting optics 32 and onto the MNS 12. The light then reflects off the cantilever 16 and the substrate 18 and into a digital camera 34. In a preferred embodiment, the reflected light passes through at least one of imaging optics 36 and a spatial filter 38 before being recorded by the digital camera 34, preferably a charge coupled device (CCD). A recorded motion of the cantilever 16 is received and processed by a digital signal processor 40 to extract information about the sinusoidal electric field 26. In an embodiment of this invention, the subsystem 14 includes a signal generator 52 which produces a potential oscillating with a reference frequency $\omega_r$ that can be used for heterodyning to detect the electromagnetic field with frequency $\omega=\omega_r+\omega_o$.

Another embodiment of the subsystem for measuring and recording the movement of the cantilever can further include high magnification diffraction limited optics, a MHz range voltage source and a stroboscopic video analyzer with a frequency modulated phase-locked loop.

By extracting information about the movement of the cantilevers 16, including an amplitude response, $\Delta x$, and a resonance frequency of the cantilever 16, information about the sinusoidal electric field 26 can be calculated including a frequency of the sinusoidal electric field 26, $\omega$. For example, assuming the cantilever 16 comprises an electrically nonconductive stem 20 and the tip 22 comprises a conductive micro sphere, an amplitude response, as a function of frequency ω, of the cantilever is:

$$\Delta x(\omega) = \frac{qE}{m\sqrt{(\omega^2 - \omega_0^2)^2 + \left(\omega\frac{\omega_0}{Q}\right)^2}} \quad (1)$$

where q is the charge on the tip 22, $\omega_0$ is a resonance frequency of the cantilever 16, E is the external electric field 26, m is the mass of the system and Q is the quality factor of the cantilever 16.

As with every mechanical system at a finite temperature there will be a component of noise, which is described as thermomechanical noise. This invention limits the impact of thermomechanical noise by operating in regime where the signal to be detected produces cantilever oscillations which are greater than the thermomechanical noise. In this invention, the thermomechanical noise for the cantilever at a temperature T and a bandwidth B is given by:

$$\langle \delta x(\omega)_{TM}^2 \rangle^{\frac{1}{2}} = \sqrt{\frac{4k_B TB}{Qk} \frac{\omega_0^3}{(\omega^2 - \omega_0^2)^2 - \frac{\omega_0^4}{Q^2}}} \quad (2)$$

At low frequencies ($\omega \ll \omega_0$) this noise becomes:

$$\langle \delta x(\omega)_{TM}^2 \rangle^{\frac{1}{2}} = \sqrt{\frac{4k_B TB}{Qk} \frac{\omega_0^3}{(\omega^2 - \omega_0^2)^2 - \frac{\omega_0^4}{Q^2}}} \rightarrow \sqrt{\frac{4k_B TB}{Qk\omega_0}} \quad (3)$$

In order to obtain analytical expressions for a fundamentally limited detector performance, a signal-to-noise ratio, $\Delta x/\langle \delta x^2 \rangle^{1/2}$, must be calculated:

$$\frac{\Delta x}{\langle \delta x_{TM}^2 \rangle^{\frac{1}{2}}} = \frac{q}{m} \frac{1}{\sqrt{\frac{4k_B TB}{Qk\omega_0}} \sqrt{(\omega^2 - \omega_0^2)^2 + \frac{\omega^2 \omega_0^2}{Q^2}}} E \quad (4)$$

Defining, a Noise Equivalent Electric Field Difference (NEEFD) as the electric field for which the signal to noise ratio equals unity, leads to:

$$NEEFD = \frac{m}{q}\sqrt{\frac{4k_B TB}{Qk\omega_0}} \sqrt{(\omega^2 - \omega_0^2)^2 + \frac{\omega^2 \omega_0^2}{Q^2}} \quad (5)$$

Using the expressions derived above, estimates of both the NEEFD and the thermomechanical noise, as a function of frequency, can be calculated. Note that for a low frequency limit condition, the frequency dependent term in Eqn. (1) becomes unity and the following expression can be used to estimate static responses, $\Delta x = q E/k$. Assuming values for the parameters shown in Table 1, then for frequencies much smaller that the cantilever resonance frequency, NEEFD=3.98×10$^{-6}$ V/m. This corresponds to a mechanical response $\Delta x$=(10$^{-12}$ C×3.98×10$^{-6}$ V/m)/(10$^{-5}$ N/m)=6.37× 10$^{-14}$ m. Which corresponds to an electric field sensitivity of $\Delta E = k \Delta x/q$=10$^{-5}$ N/m×10$^{-12}$ m)/(10$^{-12}$ C)=10$^{-5}$ V/m.

TABLE 1

| Parameter Values | |
|---|---|
| mass, m | 10$^{-15}$ kg |
| spring constant, k | 10$^{-5}$ N/m |
| charge, q | 10$^{-15}$ C |
| Bandwidth, B | 10 Hz |

In a preferred embodiment, in order to achieve a high dynamic range and a wide spectral response, the cantilever resonance frequency is preferably tunable. In one embodiment, the cantilever resonance frequency can be tuned, during a microfabrication process, by including a piezoelectric element, not shown, at a base of the cantilever 16 to modify a stiffness of the cantilever.

In another embodiment of this invention, the cantilever resonance frequency is tunable by modulating an applied voltage V(t)=V$_0$ cos($\omega_r$t+$\phi$) of the cantilever, which serves as the source of the electric charge on the cantilever, given by q(t)=V(t) R=q$_0$ cos($\omega_r$t+$\phi$). Assuming the oscillation is directed along the x-axis, then at large distances r>>R a time varying electric field component is given by $$E_r(r, \theta, t) = \frac{2q_0 L}{r^3}\cos(\vartheta)\sin(\omega_0 t)\sin(\omega_r t + \varphi)$$

A frequency $\omega_r$ will serve as a reference heterodyning frequency that can be varied to achieve a wide dynamic range. An additional advantage of this embodiment is that it is possible to cancel a local electric field of a local oscillator if devices are made in pairs and the applied voltage is out of phase by π. Furthermore, fabricating the devices in pairs is equivalent to micro-tuning forks. A mechanical Q of tuning forks can be extremely high which can be very beneficial to the present application. There is also the possibility of having the tuning forks charged in phase with each other, thereby creating a micro AC electric field emitter for signal transmission as well as for detection.

While there has been shown and described what are at present considered the preferred embodiments of the invention, it will be obvious to those skilled in the art that various changes and modifications can be prepared therein without departing from the scope of the inventions defined by the appended claims.

What is claimed is:

1. A system for detecting at least one of an electrical field and an electromagnetic field comprising:
   a substrate comprising a semiconductor material; and
   an array of cantilevers each including a stem and a tip, the stem of each of the cantilevers attached generally perpendicular to the substrate and separated from adjacent stems within the array by a portion of the substrate, the tip positioned on the stem at a position opposite a stem end attached to the substrate, wherein the tip includes an electric charge q and wherein the cantilever deflects from an initial position in the presence of at least one of the electric field and the electromagnetic field.

2. The system of claim 1, wherein the tip comprises a microsphere.

3. A system for detecting at least one of an electrical field and an electromagnetic field comprising:
   a substrate comprising a semiconductor material; and a cantilever including a stem and a tip, the stem attached generally perpendicular to the substrate and the tip positioned on the stem at a position opposite the substrate, wherein the tip includes an electric charge q and wherein the cantilever deflects from an initial position in the presence of at least one of the electric field and the electromagnetic field, wherein the tip comprises a microsphere comprising glass.

4. The system of claim 1, wherein the charge q is a positive charge.

5. The system of claim 1, wherein the cantilever is disposed in an inert gas atmosphere.

6. The system of claim 3 further comprising:
an array of cantilevers on the substrate.

7. The system of claim 1 further comprising:
a subsystem for measuring a movement of the cantilever including a digital signal processor, a collimated optical beam and a camera.

8. The system of claim 7 further comprising:
a stroboscopic video analyzer and a frequency modulated phase-locked loop to detect frequencies.

9. The system of claim 1 further comprising:
a conductor loop positioned within the substrate;
a signal generator in electrical connection with the digital signal processor and the loop of conductor, wherein modulation of a current passing through the loop of conductor produces a reference frequency for heterodyning to detect a frequency of the at least one of the electrical field and the electromagnetic field.

10. The system of claim 1, wherein a cantilever resonance frequency of the cantilever is tunable by modulating an applied voltage of the cantilever.

11. The system of claim 1 further comprising:
a piezoelectric element positioned on the stem, wherein the piezoelectric element modifies a stiffness of the cantilever.

12. A system for detecting at least one of an electrical field and an electromagnetic field comprising:
a substrate;
a cantilever including a stem and a tip, the stem attached generally perpendicular to the substrate and the tip positioned on the stem at a position opposite the substrate, wherein the tip comprises a microsphere made of glass and includes an electric charge q;
a driver including a light source and a projecting optic shining a light on the cantilever and the substrate;
a digital camera, an imaging optics and a spatial filter positioned over the cantilever and the substrate to capture a reflected light from the cantilever and the substrate; and
wherein the cantilever deflects from an initial position in the presence of at least one of the electric field and the electromagnetic field.

13. The system of claim 12, wherein the charge q is a positive charge.

14. The system of claim 12, wherein the cantilever is disposed in an inert gas atmosphere.

15. The system of claim 12 further comprising:
an array of cantilevers on the substrate.

16. The system of claim 12 further comprising:
a digital signal processor in electrical connection with the driver and the digital camera.

17. The system of claim 12, wherein a cantilever resonance frequency is tunable by modulating an applied voltage of the cantilever.

18. The system of claim 12 further comprising:
a piezoelectric element positioned on the stem, wherein the piezoelectric element modifies a stiffness of the cantilever.

19. The system of claim 1, further comprising:
a driver including a light source and a projecting optic shining a light on the cantilevers and the substrate;
a digital camera, an imaging optics and a spatial filter positioned over the cantilevers and the substrate to capture a reflected light from the cantilevers and the substrate; and
wherein the cantilevers deflect from an initial position in the presence of at least one of the electric field and the electromagnetic field.

20. The system of claim 1, wherein a movement of each tip of the cantilevers traces a sinusoidal wave of the at least one of an electrical field and an electromagnetic field.

* * * * *